United States Patent [19]

Lancaster

[11] 4,105,472

[45] Aug. 8, 1978

[54] PREPARATION OF SILICON DOPED MERCURY CADMIUM TELLURIDE

[75] Inventor: Robert A. Lancaster, Brookline, Mass.

[73] Assignee: Honeywell, Inc., Minneapolis, Minn.

[21] Appl. No.: 875,267

[22] Filed: Feb. 6, 1978

Related U.S. Application Data

[62] Division of Ser. No. 757,270, Jan. 6, 1977, Pat. No. 4,087,293.

[51] Int. Cl.$^2$ .............................................. H01L 21/02
[52] U.S. Cl. ................................ 148/1.5; 136/89 ST; 252/62.3 ZT; 357/11
[58] Field of Search ...................... 75/134 H, 135, 139; 136/89 ST, 89 CD; 148/1.5, 33, 186, 187, 188, 189; 252/62.3 ZT; 357/11; 156/605

[56] References Cited

U.S. PATENT DOCUMENTS

| 3,191,045 | 6/1965 | Colman | 136/89 CD |
| 3,740,690 | 6/1973 | Schornhorst | 357/30 |

Primary Examiner—G. Ozaki
Attorney, Agent, or Firm—John S. Munday

[57] ABSTRACT

Mercury cadmium telluride is described having a quantity of a silicon dispersed therein in an amount to measurably increase the donor concentration of the mercury cadmium telluride. Silicon has been found to substitute for metal, either mercury or cadmium, in the mercury cadmium telluride crystal. Doping of a region of mercury cadmium telluride with silicon can produce a PN junction when the adjacent region is P-type, and an N—N+ type junction when the adjacent region is N-type.

5 Claims, 1 Drawing Figure

HALL COEFFICIENT VERSUS INVERSE TEMPERATURE FOR SILICON DOPED AND STANDARD SAMPLES OF MERCURY CADMIUM TELLURIDE.

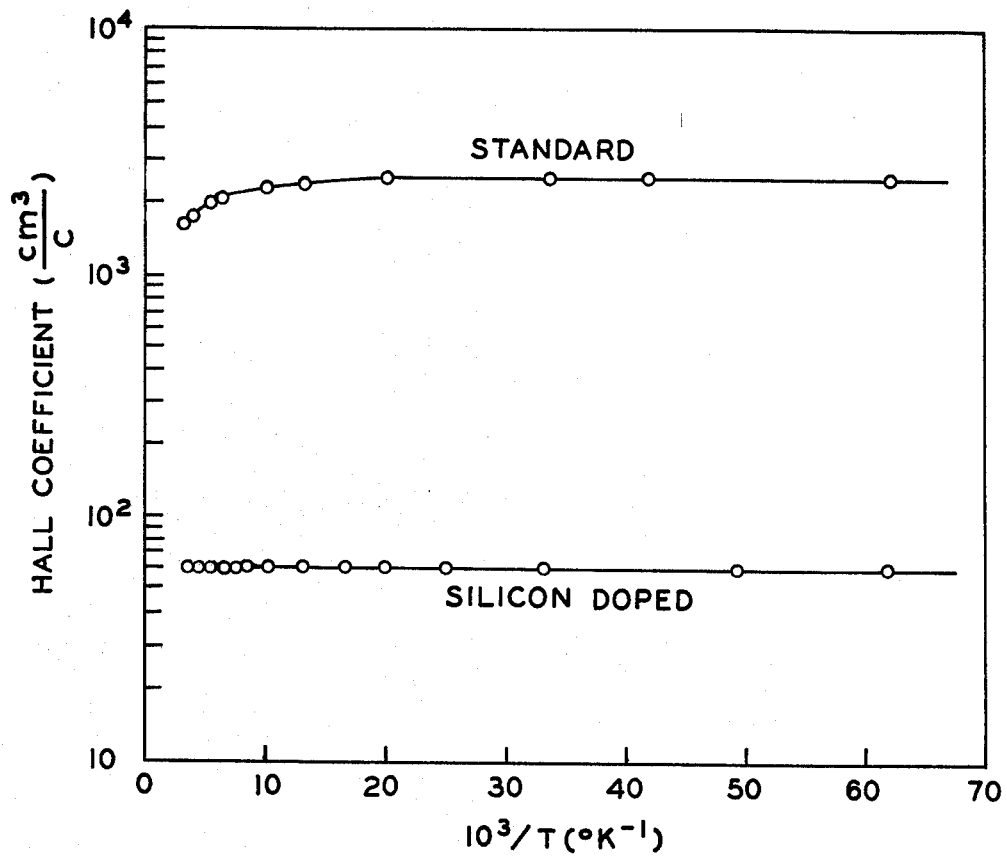
HALL COEFFICIENT VERSUS INVERSE TEMPERATURE FOR SILICON DOPED AND STANDARD SAMPLES OF MERCURY CADMIUM TELLURIDE.

PREPARATION OF SILICON DOPED MERCURY CADMIUM TELLURIDE

This is a division of application, Ser. No. 757,270, filed Jan. 6, 1977 now U.S. Pat. No. 4,087,293.

BACKGROUND OF THE INVENTION

The present invention is concerned with mercury cadmium telluride semiconductor devices. In particular, the present invention is directed to a method of introducing impurities into mercury cadmium telluride. For the purposes of this specification, the common chemical equations for mercury cadmium telluride (Hg,Cd)Te or $Hg_{1-x}Cd_xTe$, will be used.

Mercury cadmium telluride is an intrinsic photodetector material which consists of a mixture of cadmium telluride, a wide gap semiconductor ($E_g = 1.6eV$), with mercury telluride, which is a semimetal having a negative energy gap of about $-0.3eV$. The energy gap of the alloy varies approximately linearly with $x$, the mole fraction of cadmium telluride in the alloy. By properly selecting $x$, it is possible to obtain (Hg,Cd)Te detector material having a peak response over a wide range of infrared wavelengths. High performance (Hg,Cd)Te detectors have been achieved for wavelengths of from about one to about 30 microns.

Mercury cadmium telluride photodiodes have found increasing use in recent years. With this increasing use, more sophisticated photodiodes such as (Hg,Cd)Te reach-through avalanche photodiodes have become desirable. As a result, improved methods of forming PN junctions in (Hg,Cd)Te have become highly desirable. Also, other uses of either P-type or N-type material doped to various degrees have found uses not previously considered.

In another area of technical development, (Hg,Cd)Te is of particular importance as a detector material for the important 8 to 14 micron atmospheric transmission "window". Extrinsic photoconductor detectors, noteably mercury doped germanium, have been available with high performances in the 8 to 14 micron wavelength interval. These extrinsic photoconductors, however, require very low operating temperatures of below 30° K. (Hg,Cd)Te intrinsic photodetectors, having a spectral cutoff of 14 microns, on the other hand, are capable of high performance at 77° K.

The possible application of (Hg,Cd)Te as an intrinsic photodetector material for infrared wavelengths was first suggested by W. G. Lawson, et al, *J. Phys. Chem. Solids*, 9, 325 (1959). Since that time extensive investigation of (Hg,Cd)Te detectors has been achieved for wavelengths from about one to 30 microns.

Despite the potential advantages of (Hg,Cd)Te as an infrared detector material, (Hg,Cd)Te photodetectors have recently found wide use in infrared detector systems. A difficulty with (Hg,Cd)Te has been in preparing high quality, uniform material in a consistent manner. The preparation of (Hg,Cd)Te crystals having the desired conductivity type, has been found to be particularly difficult.

Several properties of the (Hg,Cd)Te alloy system cause the difficulties which have been encountered in preparing (Hg,Cd)Te. First, the phase diagram for the alloy shows a marked difference between the liquidus and solidus curves, thus resulting in segregation of CdTe with respect to HgTe during crystal growth. Crystal growth methods, which involve slow cooling along the length of an ingot, produce an inhomogeneous body of (Hg,Cd)Te. Second, the high vapor pressure of Hg over the melt requires special care to maintain melt stoichiometry. Third, the segregation of excess Te can give rise to a pronounced constitutional super cooling.

A number of bulk growth techniques have been investigated. Zone melting methods for preparing (Hg,Cd)Te have been developed by B. E. Bartlett, et al, *J. Mater. Sci.*, 4, 266 (1969); E. Z. Dzuiba, *J. of Electrochem. Soc.*, 116, 104 (1969); and R. Ueda, et al, *J. Crystal Growth*, 13/14, 688 (1972). Still other bulk growth techniques for (Hg,Cd)Te have been described by J. Blair, et al, *Conference on Metallurgy of Elemental and Compound Semiconductors*, 12, 393 (1961) and J. C. Woolley, et al, *J. Phys. Chem. Solids*, 13, 151 (1960).

All of the bulk growth techniques require additional post-growth processing steps to produce photodetectors. The crystal must be sliced and the surface prepared by polishing and etching. The (Hg,Cd)Te slice is then epoxied to a substrate such as germanium. This is a particular disadvantage in the fabrication of detector arrays, since it is inconvenient, expensive and generally unsatisfactory to fabricate arrays by assembling discrete detector elements. The epoxy layer, in addition to complicating detector and detector array fabrication, results in a thermal barrier between the (Hg,Cd)Te and the substrate. This thermal barrier can adversely affect performance when significant heating occurs during use.

Epitaxial growth techniques defined below offer the possibility of eliminating the epoxy layer and avoiding many of the post-growth processing steps required for bulk growth techniques. An epitaxial layer is a smooth continuous film grown on a substrate, such that the film crystal structure corresponds to and is determined by that of the substrate. The desired epitaxial layer is single crystal with uniform thickness and electrical properties. The substrate has a different composition or electrical properties from that of the epitaxial layer.

Vapor phase epitaxial growth techniques have been investigated in an attempt to grow (Hg,Cd)Te layers. One vapor phase epitaxial growth technique which has been investigated is the vapor transport of the three constituent elements to a substrate with compound and alloy formation at that point. The vapor transport generally involves additional materials as transport agents, such as halogens. The vapor transport techniques have been described by R. Ruehrwein (U.S. Pat. No. 3,496,024), G. Manley, et al (U.S. Pat. No. 3,619,282), D. Carpenter, et al (U.S. Pat. No. 3,619,283) and R. Lee, et al (U.S. Pat. No. 3,642,529).

Another vapor phase epitaxial growth process has been studied by R. J. Hager, et al (U.S. Pat. No. 3,725,135) and by G. Coehn-Solal, et al, *Compt. Rend.*, 261, 931 (1965). This approach involves an evaporation--diffusion mechanism without the use of any additional materials as transport agents. In this method, a single crystal wafer of CdTe is used as the substrate, and either HgTe or (Hg,Cd)Te is used as the source. At a high enough temperature the material evaporates from the source and migrates in the vapor phase to the CdTe substrate, on which it deposits epitaxially.

In spite of their apparent advantage, epitaxial films of (Hg,Cd)Te formed by vapor phase techniques have been less satisfactory than (Hg,Cd)Te crystals formed by bulk growth because of a compositional gradient along the crystal growth direction which has made them less desirable for detector applications.

Other epitaxial growth techniques have also been attempted. R. Ludeke, et al, *J. Appl. Phys.*, 37, 3499 (1966) grew epitaxial films of (Hg,Cd)Te on single crystal barium fluoride substrates by flash evaporation in vacuum. The samples were grown for studies of optical properties. The technique is probably not practical for the preparation of detector material. H. Krause, et al, *J. Electrochem. Soc.*, 114, 616 (1967), deposited films of (Hg,Cd)Te on single crystal substrates of sodium chloride, germanium and sapphire by means of cathodic sputtering. The resulting films were amorphous as deposited and become crystalline only upon subsequent annealing. The formation of (Hg,Cd)Te by mercury ion bombardment of CdTe has been attempted by N. Foss, *J. Appl. Phys.*, 39, 6029 (1968). This approach was not successful in forming an epitaxial layer.

Another epitaxial growth technique, liquid phase epitaxy, has been used with success in growing other semiconductor materials and in growing garnets for bubble memory applications. In particular, liquid phase epitaxy has been used successfully in the preparation of gallium arsenide, gallium phosphide and lead tin telluride. These materials generally differ from (Hg,Cd)Te, however, in that they (GaAs and GaP) do not have all the severe segregation problem present in (Hg,Cd)Te nor do they have the problem of high vapor pressure of mercury over the melt.

U.S. Pat. No. 3,718,511 by M. Moulin, which describes liquid phase epitaxial growth of lead tin telluride and lead tin selenide, suggests that analogous growth arrangements could be made for the alloys zinc selenide telluride and (Hg,Cd)Te. The patent, however, gives specific examples of liquid phase epitaxy only for lead tin telluride and lead tin selenide. Despite the suggestion by Moulin, prior attempts to grow (Hg,Cd)Te by liquid phase epitaxy have proved unsuccessful. Thermodynamic considerations or experimental difficulties have prevented achievement of detector-grade (Hg,Cd)Te material.

However, high quality detector-grade (Hg,Cd)Te epitaxial layers have been formed by the liquid phase epitaxial growth techniques of U.S. Pat. No. 3,902,924. A liquid solution of mercury, cadmium and tellurium is formed and is contacted with a substrate. The liquid solution in the boundary layer next to the substrate has a liquidus composition which is corresponding to the solidus composition of the desired (Hg,Cd)Te layer at the growth temperature by the appropriate tie line. Supersaturation produces growth of a layer of (Hg,Cd)Te on the substrate.

The electrical properties of mercury cadmium telluride can be altered either by changing the stoichiometry or by foreign impurity doping. It is generally theorized that interstitial mercury and cadmium produce N-type conductivity while mercury and cadmium vacancies as well as tellurium interstitials produce P-type conductivity. In Applied Physics Letters 10, 241 (1967) C. Verie and J. Ayas suggested the formation of PN junctions in mercury cadmium telluride by the adjustment of stoichiometry. The formation of PN junctions by diffusion of foreign impurities into mercury cadmium telluride is complicated by two requirements. First, it has been thought that the impurity must be able to be diffused into mercury cadmium telluride at a reasonably low temperature. This is necessary to prevent excessive dissociation of the mercury telluride, which would drastically change stoichiometry. The relatively small dissociation energy of mercury telluride greatly complicates the diffusion and annealing procedures for junction preparation. Second, the impurity atom must not completely replace mercury in the lattice and form yet another compound rather than simply dope the crystal. This problem is also due to the small dissociation energy of mercury telluride. Examples of compounds formed by impurities include $InTe_3$, $TeI_2$ and $TeI_4$. None of these materials affect the donor or acceptor concentration in the manner desired.

In U.S. Pat. No. 3,743,553, PN junctions are formed in an N-type body of mercury cadmium telluride by depositing a layer of gold on a surface of the N-type body and heating the body to diffuse the gold into the body, thereby forming a region of P-type conductivity in the N-type body.

The formation of PN junctions in (Hg,Cd)Te is complicated by the small dissociation energy of mercury telluride in the alloy. So too are the difficulties incurred in adjusting carrier concentrations of adjoining regions of the same type. The formation of PN junctions must not cause excessive dissociation of the mercury telluride, since this will adversely affect the electrical and optical properties of the resulting devices.

Several techniques have been developed for forming N-type layers on a P-type body of (Hg,Cd)Te. Among these techniques are bombardment with protons, electrons or mercury ions. These techniques create an N-type layer by creating a damage induced donor state. These techniques are described in Foyt, et al, "Type Conversion and N-P Junction Formation in (Hg,Cd)Te Produced by Proton Bombardment", Appl. Phys. Let., 18, 321 (1971); McIngailis, et al, "Electron Radiation Damage and Annealing of (Hg,Cd)Te at Low Temperatures," J. Appl. Phys., 44, 2647 (1973); and Fiorito, et al, "Hg-Implanted (Hg,Cd)Te Infrared low Photovoltaic Detectors in the 8 to 14 Micron Range", Appl. Phys. Let., 23, 448 (1973).

Another technique of forming N-type on P-type (Hg,Cd)Te is described by Marine, et al, "Infrared Photovoltaic Detectors from Ion-Implanted (Hg,Cd)Te", Appl. Phys. Let., 23, 450 (1973). This method involves aluminum ion implantation and subsequent anneal at 300° C for one hour to form an N-type in a P-type (Hg,Cd)Te body.

Formation of P-type layers on N-type (Hg,Cd)Te, is limited to two techniques. One common method of forming P-type regions in N-type (Hg,Cd)Te is by depositing a gold layer on a surface of the N-type body and then heating the body to diffuse the gold, thereby forming a region of P-type conductivity. This method is described in U.S. Pat. No. 3,743,553, by M. W. Scott, et al. While this method is generally satisfactory, it does have some shortcomings. In particular, it is difficult to form very abrupt, well-defined PN junctions because gold diffuses extremely rapidly in (Hg,Cd)Te. Devices such as reach-through avalanche photodiodes and wide bandwidth photodiodes, therefore, are difficult, if not impossible to fabricate using gold diffusion.

Another method has been proposed in a commonly owned copending application, filed Mar. 1, 1976, having Ser. No. 662,293, now U.S. Pat. No. 4,003,759. That application discloses a method of introducing acceptor impurities into a region of an (Hg,Cd)Te body. This method allows fabrication of an abrupt, well-defined PN junctions in (Hg,Cd)Te, and comprises implanting gold ions into the (Hg,Cd)Te body and heat treating the body at a relatively low temperature for a short duration.

SUMMARY OF THE INVENTION

It has now been discovered that mercury cadmium telluride can be made with increased donor concentration by the addition of silicon thereto. Quantities of silicon in a final product ranging from $10^{10}$ to $10^{20}$ atoms per cubic centimeter will provide a measurable increase in the donor concentration of mercury cadmium telluride, when compared to identical mercury cadmium telluride which is otherwise identical but containing no silicon. It has been found that silicon is present at the lattice sites in the mercury cadmium telluride crystal, and more particularly silicon is substituted on the metal sites in the crystal lattice.

Due to the ability of silicon to measurably increase the donor concentration of mercury cadmium telluride, junctions between adjacent regions of mercury cadmium telluride can be prepared by the addition of silicon to one of the regions so that where a first region is P-type and the second region is N-type, due to the addition of silicon, a PN junction is formed. Similarly, where the first region is N-type and the second region contains silicon according to the present invention, an N-N+ type junction is formed. Those skilled in the art will readily appreciate the uses to which these junctions can be put.

It has been found that mercury cadmium telluride can be prepared through the bulk growing of crystals in a manner wherein an additional step is taken comprising the addition of silicon to the mercury cadmium telluride prior to formation of the crystal. The results of this additional step, adding silicon to the melt prior to crystallization, provides a quantity of mercury cadmium telluride in which there is a measurable increase in the donor concentration because of the silicon. Quantities of silicon ranging from $10^{10}$ to $10^{20}$ atoms per cubic centimeter will provide this increased donor concentration.

For a more complete understanding of the invention, reference is hereby made to the FIGURE, in which the results of doping mercury cadmium telluride with silicon are presented. Specifically, the hall coefficient is plotted graphically versus the inverse temperature, measured in degrees Kelvin, for silicon doped and reference samples of mercury cadmium telluride. Both samples were prepared under identical circumstances, with the only difference being the addition of elemental silicon to the one sample, doped to a level of approximately $10^{17}$ atoms per cubic centimeter. The results in the FIGURE clearly show that normal N-type mercury cadmium telluride was converted to heavily doped N-type material, clearly indicating that silicon is a well-behaved donor in the mercury cadmium telluride system.

In a copending, commonly owned application, filed of even date herewith in the names of: Eric S. Johnson and J. L. Schmit, Ser. No. 757,269, now U.S. Pat. No. 4,089,714, a method of diffusing silicon into mercury cadmium telluride is disclosed. This method, although not the subject matter of this application, further shows that silicon can and does act as a donor impurity. Doping of silicon of a part of a crystal to give a region of higher donor concentration permits the formation of PN junctions and N N+ junctions in crystals of mercury cadmium telluride. In addition, entire crystals can be doped with silicon according to the present invention followed by diffusion of materials such as gold into a region of the crystal to significantly alter the carrier concentration, again forming two areas or regions of differing conductivity type. Bulk growth of a crystal containing silicon followed by diffusion of gold can provide PN junction containing crystals as well as N N+ containing crystals, depending upon the amount of silicon additionally added and the amount of gold diffused therein.

Having thus described the invention, it will be readily apparent to those familiar with this art that many modifications of the composition and processes are possible. It should be therefore understood that the invention is not to be limited by the embodiments described herein but only by the scope of the following claims.

The embodiments of the invention in which an exclusive property or right is claimed are defined as follows:

1. In a method of bulk growing crystals of mercury cadmium telluride to form a semiconductor body, the improvement comprising:
    the step of adding a quantity of silicon to said mercury cadmium telluride prior to formation of said body.

2. The method of claim 1 wherein said quantity of silicon is sufficient to measurably increase the donor concentration of said mercury cadmium telluride.

3. The method of claim 1 wherein said concentration of silicon ranges from $10^{10}$ atoms per cubic centimeter to $10^{20}$ atoms per cubic centimeter.

4. The method of claim 1 wherein said silicon is present at the lattice sites in said mercury cadmium telluride.

5. The method of claim 1 wherein said silicon is substituted for metal in said mercury cadmium telluride.

* * * * *